United States Patent
Jang et al.

(10) Patent No.: US 8,153,030 B2
(45) Date of Patent: Apr. 10, 2012

(54) METHOD OF MANUFACTURING CONDUCTIVE PARTICLE, ANISOTROPIC CONDUCTIVE ADHESIVE HAVING THE SAME, AND METHOD OF MANUFACTURING DISPLAY APPARATUS USING THE SAME

(75) Inventors: Min-Sok Jang, Cheonan-si (KR); Kyung-Hwan Ko, Cheonan-si (KR); Seung-Il Lee, Suwon-si (KR); Jin-Wook Moon, Asan-si (KR); Jeong-Geun Han, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 775 days.

(21) Appl. No.: 12/207,138

(22) Filed: Sep. 9, 2008

(65) Prior Publication Data
US 2009/0068916 A1    Mar. 12, 2009

(30) Foreign Application Priority Data

Sep. 11, 2007   (KR) ...................... 10-2007-0092218

(51) Int. Cl.
*H01B 1/22* (2006.01)
(52) U.S. Cl. ...................................... 252/512; 428/403

(58) Field of Classification Search .......... 252/512–514, 252/518.1; 428/402–407
See application file for complete search history.

(56) References Cited

U.S. PATENT DOCUMENTS

| | | | | |
|---|---|---|---|---|
| 6,926,751 | B2 * | 8/2005 | Kokubo et al. | 75/255 |
| 2004/0177921 | A1 * | 9/2004 | Yamauchi | 156/277 |
| 2007/0145585 | A1 * | 6/2007 | Jun et al. | 257/737 |
| 2008/0102277 | A1 * | 5/2008 | Bae et al. | 428/403 |
| 2010/0221545 | A1 * | 9/2010 | Abe | 428/406 |

FOREIGN PATENT DOCUMENTS

| | | |
|---|---|---|
| JP | 06-203640 | 7/1994 |
| JP | 2006-185922 | 7/2006 |
| KR | 10-2001-0065749 | 7/2001 |

* cited by examiner

*Primary Examiner* — Mark Kopec
(74) *Attorney, Agent, or Firm* — Cantor Colburn LLP

(57) ABSTRACT

In an anisotropic conductive adhesive containing a conductive particle, the conductive particle includes a resin particle that is provided with a cavity formed therein and a conductive layer surrounding a surface of the resin particle. The cavity is formed by mixing the resin particle with a reactant and partially removing the reactant from the resin particle. Thus, the conductive particle may readily absorb an external pressure, thereby providing an improved malleability to the conductive particle.

4 Claims, 9 Drawing Sheets

METHOD OF MANUFACTURING CONDUCTIVE PARTICLE, ANISOTROPIC CONDUCTIVE ADHESIVE HAVING THE SAME, AND METHOD OF MANUFACTURING DISPLAY APPARATUS USING THE SAME

This application claims priority to Korean Patent Application No. 2007-92218, filed on Sep. 11, 2007, and all the benefits accruing therefrom under 35 U.S.C. §119, the contents of which in its entirety are hereby incorporated by reference.

BACKGROUND OF THE INVENTION

This disclosure relates to a method of manufacturing a conductive particle, an anisotropic conductive adhesive having the conductive particle, and a method of manufacturing a display apparatus using the anisotropic conductive adhesive.

For purposes of mounting a driver integrated circuit on a display panel, chip-on-glass (COG) methods and tape-automated-bonding (TAB) methods have been widely used. According to the COG method, a driver integrated circuit is directly mounted on the display panel without using a separate structure. In the TAB method, a driver integrated circuit is indirectly connected to the display panel through a tape carrier package or a film (chip-on-film), where the driver integrated circuit is mounted.

In this method, the tape carrier package or the chip-on-film, on which a driver integrated circuit is mounted, serves as a signal transmission member and is electrically connected to the display panel through an anisotropic conductive film (ACF). The ACF is also applied when the signal transmission member is bonded to a printed circuit board on which a driving circuit is printed.

In order to electrically connect the signal transmission member to the display panel, an ACF containing conductive particles is disposed between terminals formed on the signal transmission member and terminals formed on the display panel. Then, heat and pressure is applied to the ACF such that the conductive particles contained therein are compressed and make contact with the terminals of the signal transmission member and display panel, thereby electrically connecting the signal transmission member and the display panel with each other.

BRIEF SUMMARY OF THE INVENTION

Disclosed is a method of manufacturing a conductive particle. A resin is mixed with a first reactant to form a particle, and the first reactant is removed from the particle using a second reactant to form a cavity in the particle. Then, the particle is heat-treated to reduce the volume of the cavity, and then a conductive layer is formed to surround the particle.

Further disclosed is a method of manufacturing a display apparatus. A display panel on which a first terminal is formed and a driver on which a second terminal is formed are prepared. An anisotropic conductive adhesive having the above-described conductive particle is formed on at least one of the first terminal and the second terminal. Then, the first terminal and the second terminal are positioned to face each other with the anisotropic conductive adhesive interposed between the first and second terminals, and the first and second terminals are compressed to be electrically connected to each other through the conductive particle.

Further disclosed is an anisotropic conductive adhesive including an adhesive and the above-mentioned conductive particle dispersed in the adhesive. The conductive particle includes a particle having a cavity formed therein and a conductive layer surrounding the particle.

The conductive particle contained in the anisotropic conductive adhesive is provided with the cavity and thus the conductive particle can readily absorb an external pressure, thereby enabling to provide an improved malleability to the entire anisotropic conductive adhesive.

BRIEF DESCRIPTION OF THE DRAWINGS

The above and other aspects and advantages of the disclosed embodiments will become readily apparent by the following detailed description when considered in conjunction with the accompanying drawings, wherein.

DETAILED DESCRIPTION OF THE EMBODIMENTS

Figure 1:
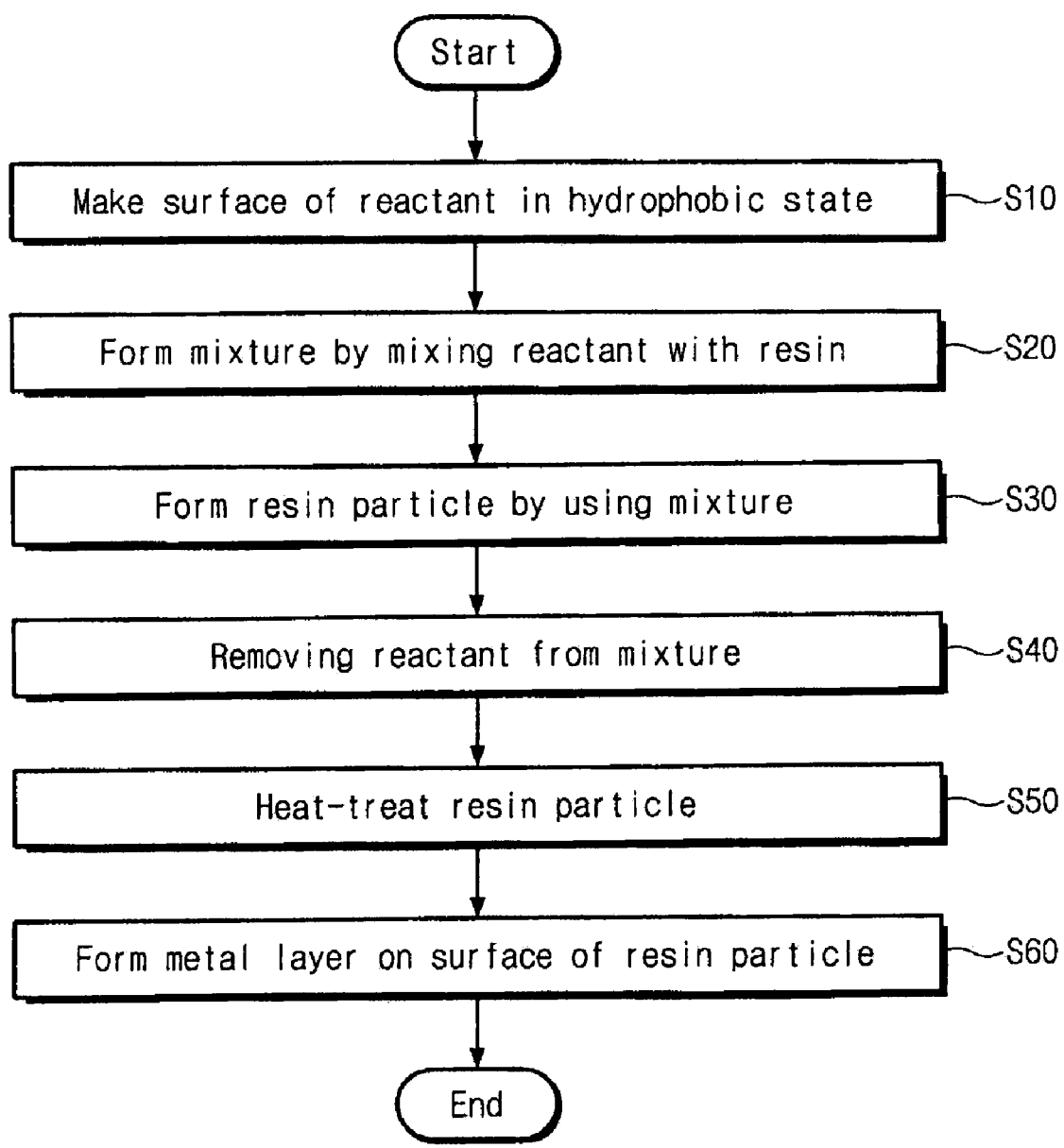
FIG. 1 is a flowchart illustrating a method of manufacturing a conductive particle according to an exemplary embodiment of the present invention.

Disclosed embodiments will now be described more fully with reference to the accompanying drawings, in which exemplary embodiments are shown.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Terms denoting spatial inter-relationships, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawings, like reference numerals denote like elements and the thicknesses of layers and regions are exaggerated for clarity.

FIG. 1 is a flowchart illustrating a method of manufacturing a conductive particle according to an exemplary embodiment, and FIGS. 2 to 6 illustrate steps of manufacturing a conductive particle according to an exemplary embodiment.

Referring to FIG. 1, the formation of a conductive particle includes converting the surface of a reactant into a hydrophobic state (S10), forming a mixture by mixing the reactant with a resin (S20), forming a resin particle using the mixture (S30), removing the reactant from the resin particle by reacting the resin particle with a solvent (S40), heat-treating the resin particle (S50), and forming a metal layer on the surface of the resin particle (S60).

In step S40, as the reactant is removed from the resin particle by the solvent, cavities are formed on the surface of the resin particle and also inside the resin particle. In step S50, while the resin particle is heat-treated, the volume of the cavities is reduced, so that fine concave portions are formed on the surface of the resin particle. Since the fine concave portions are randomly formed on the surface of the resin particle, the fine concave portions may appear to be wrinkles. Further details on the conductive particle will be described hereinafter with reference to FIGS. 2 to 6.

Figure 2:
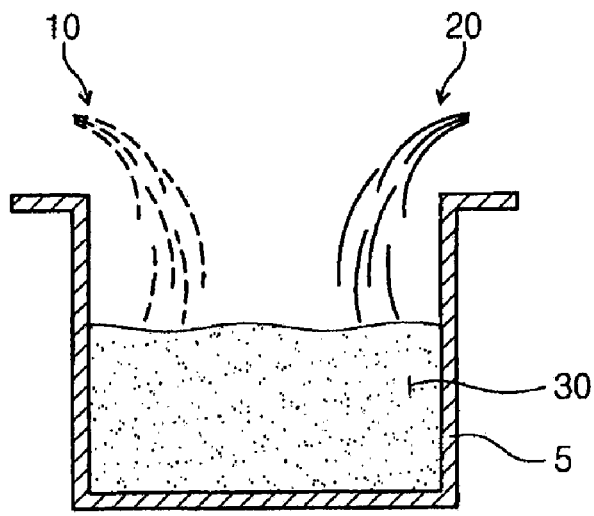
FIGS. 2 to 6 illustrate steps of manufacturing a conductive particle according to an exemplary embodiment of the present invention.

Referring to FIG. 2, the reactant 30 is contained in a container 5. Then, a first surface treating agent 10 and a second surface treating agent 20 are supplied into the container 5 such that the reactant 30, the first surface treating agent 10, and the second surface treating agent 20 are reacted with each other to form a hydrophobic reactant 31 (see FIG. 3).

When the reactant 30 comprises calcium carbonate ($CaCO_3$) and the second surface treating agent 20 comprises the stearic acid, a surface treatment following below chemical reaction formula is performed relative to the surface of the reactant 30.

$CaCO_3 + RCOOH \rightarrow Ca(OH)(OOCR) + CO_2$ <Chemical Reaction Formula>

A contact angle between the reactant 30 and water may be approximately 48° when the surface treatment is performed relative to 25 percent of the surface of the reactant 30, the contact angle between the reactant 30 and water may be greater than 100° when the surface treatment is performed relative to 50 percent of the surface of the reactant 30. Accordingly, when the surface treatment is performed gradually, the surface of the reactant 30 is made the hydrophobic gradually. Here, the surface of the reactant is made hydrophobic by the first and second surface treating agents 10 and 20. Thereafter, as shown in FIG. 3, the hydrophobic reactant 31 is mixed with a resin 40 such that the hydrophobic reactant 31 is uniformly dispersed in the resin 40.

In this embodiment, the reactant 30 includes calcium carbonate ($CaCO_3$), the first surface treating agent 10 includes ethanol, and the second surface treating agent 20 includes stearic acid. The reactant 30, the first surface treating agent 10 and the second surface treating agent 20 have a mass ratio of 1:10:0.4.

In the present exemplary embodiment, the reactant 30 includes calcium carbonate ($CaCO_3$), but the reactant 30 may include various other materials such as so long as they do not react with the resin. This is because the reactant 30 is to be removed from the mixture of the reactant 30 and the resin 40 in a subsequent process.

Figure 3:
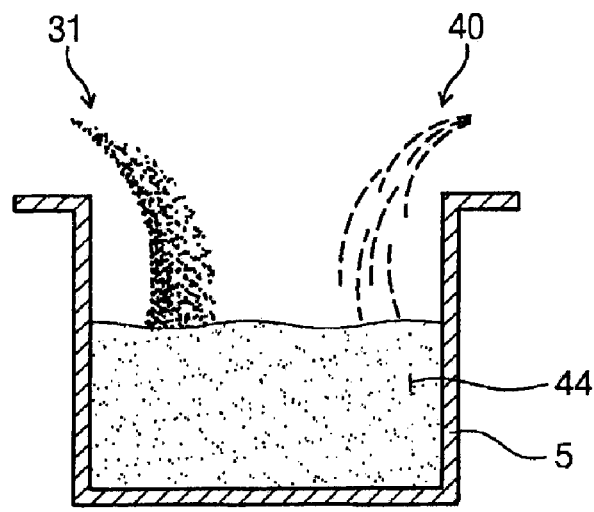

Referring to FIG. 3, the hydrophobic reactant 31 and the resin 40 are mixed and contained in the container 5. That is, the hydrophobic reactant 31 is mixed with the resin 40 to form a mixture of the resin 40 and the hydrophobic reactant 31 uniformly dispersed in the resin. This mixture serves as a particle raw material 44 to form a primary resin particle.

Figure 4:
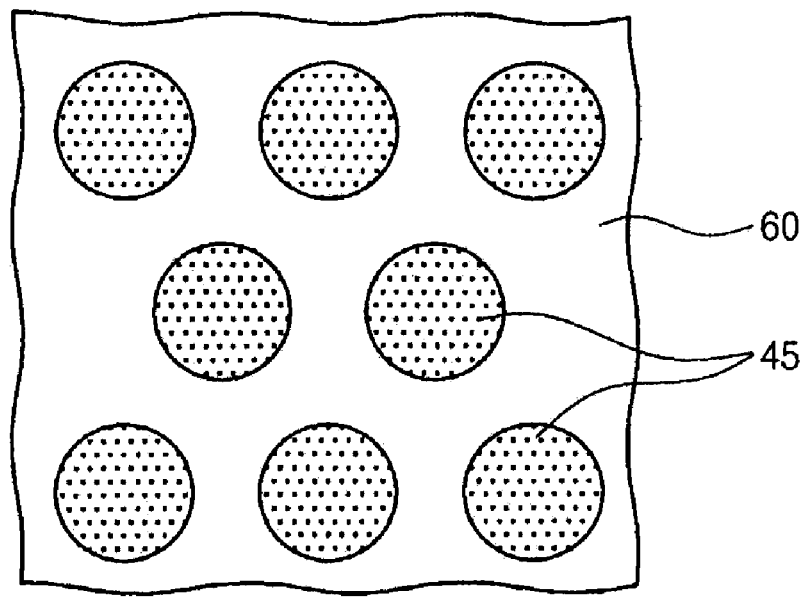
Figure 5:
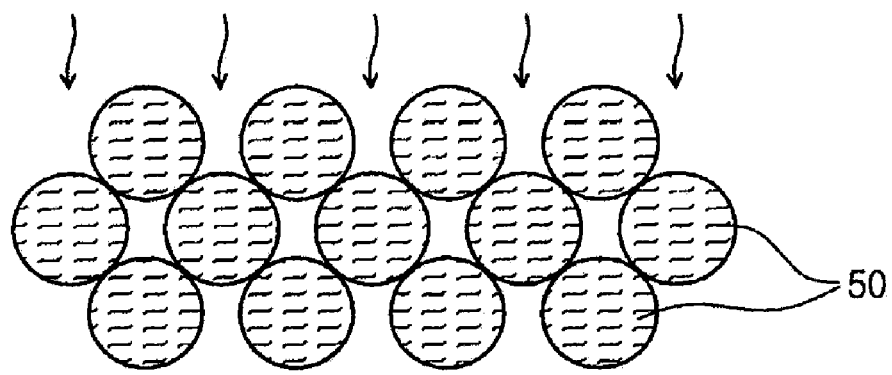

Referring to FIGS. 4 and 5, a primary resin particle 45 having a spherical shape is formed using the particle raw material 44. The primary resin particle 45 may be formed from the particle raw material 44 using polymerization, such as a seeded polymerization, a suspension polymerization, an emulsion polymerization, and a dispersion polymerization. For example, the suspension polymerization (also known as pearl polymerization, bead polymerization and granular polymerization) is a polymerization process that uses mechanical agitation to mix the monomer or mixture of monomers in a liquid phase such as water, polymerizing the monomer droplets while they are dispersed by continuous agitation.

Then, the primary resin particle 45 is reacted with a solvent 60 such that the solvent 60 dissolves the hydrophobic reactant 31 out from the previous resin particle 45. As the result, first cavities 34 are formed in the primary resin particle 45, as shown in FIG. 7B. The volume of the first cavities 34 amounts substantially to the volume of the hydrophobic reactant 31 that has been dissolved out by the solvent 60.

Since the hydrophobic reactant 31 is calcium carbonate in this embodiment, the solvent 60 may include a hydrochloric acid aqueous solution that can dissolve the calcium carbonate. In this case, in order for the solvent 60, i.e. the hydrochloric acid aqueous solution not to react with the resin substance of the primary resin particle 45, the hydrochloric acid aqueous solution may be diluted at 0.1 mol/L.

Then, the primary resin particle 45 having the first cavities 34 is heat-treated at a temperature of about 220 degrees Celsius for one hour to form a secondary resin particle 50. While heat-treating the primary resin particle 45, the volumes of the first cavities 34 formed in the primary resin particle 45 are reduced, thereby forming fine concave portions on the surface of the secondary resin particle 50.

Since massive first cavities 34 are randomly formed in the primary resin particle 45, the fine concave portions are also formed so as to be randomly distributed over the surface of the secondary resin particle 50. Consequently, the fine concave portions may appear to be wrinkles defined on the surface of the resin particle 50.

The primary previous resin particle 45 and secondary resin particle 50 will be described in further details with reference to FIGS. 7A to 7C and FIGS. 8A and 8B respectively.

Figure 6:
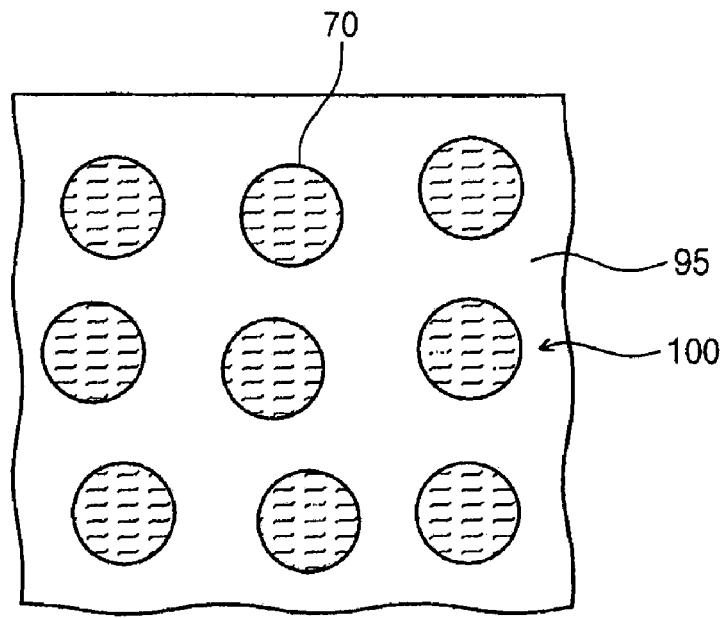

Referring to FIG. 6, the secondary resin particle 50 is reacted with a plating solution 95 to form a conductive layer 70 on the surface of the secondary resin particle 50 and consequently form a conductive particle 100 with the conductive layer 70 covered on the surface thereof.

In this exemplary embodiment, the conductive layer 70 may be formed of a metallic material such as nickel, gold, and the like through a conventional plating process. Also, the conductive layer 70 is illustrated to have a single-layer structure, but the conductive layer may have two or more layered structure.

Figure 7A:
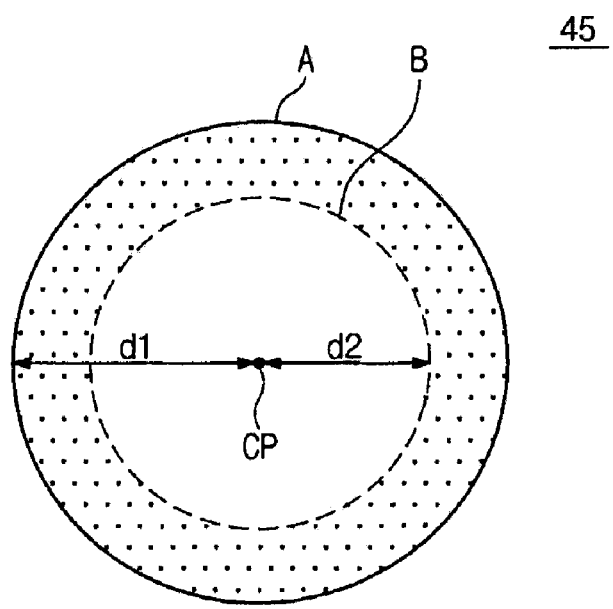
FIG. 7A is a sectional view of a primary resin particle shown in FIG. 4.
Figure 7B:
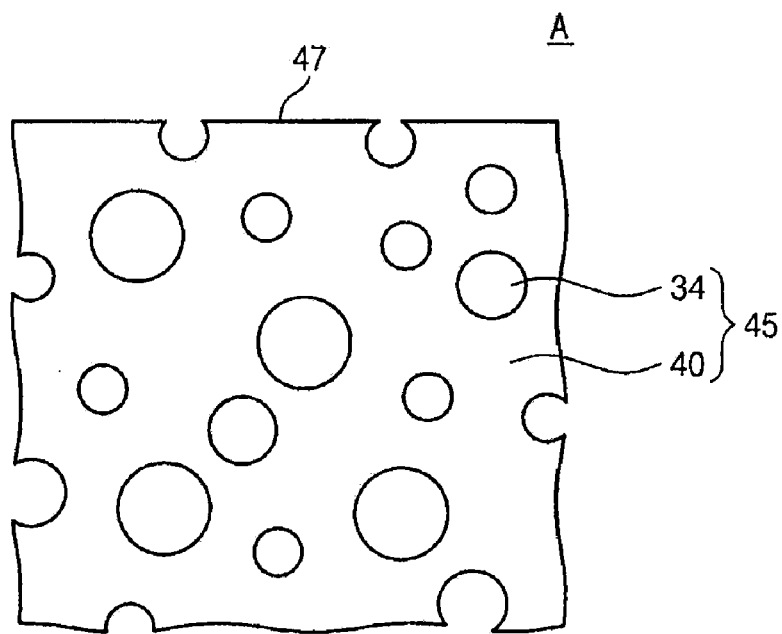
FIG. 7B is an enlarged view for the portion A in FIG. 7A.
Figure 7C:
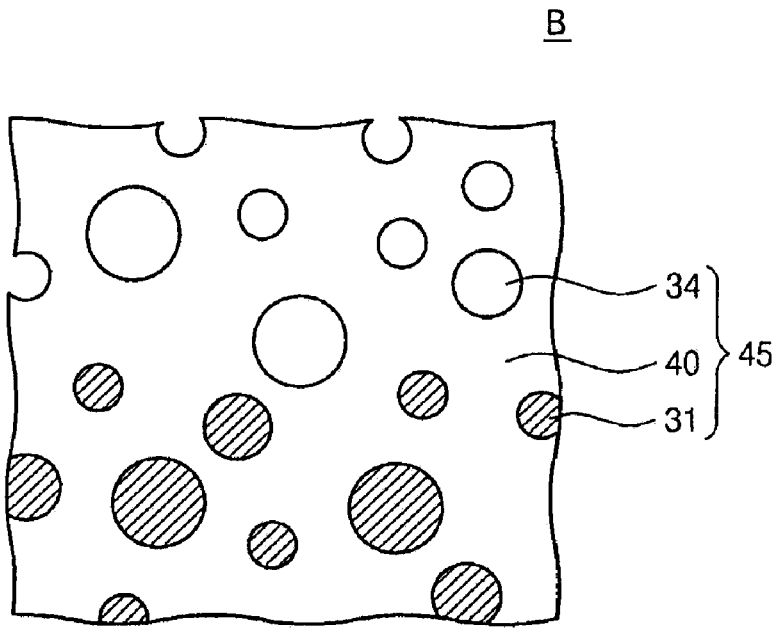
FIG. 7C is an enlarged view for the portion B in FIG. 7A.

FIG. 7A is a sectional view for the primary resin particle shown in FIG. 4, FIG. 7B is an enlarged view for the portion A of FIG. 7A, and FIG. 7C is an enlarged view for the portion B of FIG. 7A. More particularly, FIG. 7B shows the surface of the primary resin particle 45 in detail, and FIG. 7C shows the first cavities and the un-removed hydrophobic reactant in detail.

Figure 8A:
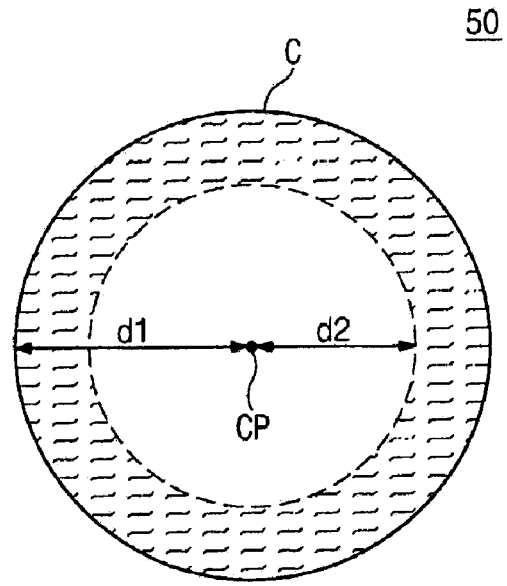
FIG. 8A is a sectional view for the resin particle shown in FIG. 5.

Referring to FIGS. 7A to 7C, the first cavities 34 are partially formed in the primary resin particle 45, mainly over the area near the surface of the particle. Specifically, it is assumed, as shown in FIG. 8A, that the primary resin particle 45 is defined as a sphere (A) having a first radius d1 and an imaginary sphere (B) having a second radius d2 is formed inside of the sphere (A), the both spheres having a common center point CP. Then, the first cavities 34 are considered to be formed in the region outside of the imaginary sphere (B). In other words, the first cavities 34 are formed spaced apart from the point CP to surround the imaginary sphere (B).

In this embodiment, the solvent 60 removes the hydrophobic reactant 31 inwardly adjacent to the surface of the primary resin particle 45. This is, the hydrophobic reactant 31 adjacent to the surface of the primary resin particle 45 is removed first, rather than the hydrophobic reactant 31 adjacent to the inner portion of the primary resin particle 45. In other words, the solvent 60 is diffused from the surface of the primary resin particle 45 toward the center portion of the primary resin particle 45 while removing the hydrophobic reactant 31. Thus, by varying the reaction time of the primary resin particle 45 with the solvent 60, the numbers and boundary of the first cavities 34 being formed inside the primary resin particle 45 can be adjusted, thereby controlling the malleability of the later-formed conductive particle 100.

For instance, when the primary resin particles 45 having a diameter of about 4 micrometers remain in contact with the solvent 60 for few minutes, the hydrophobic reactant 31 is removed from the surface of the primary resin particle 45 up to a depth of about 0.4 micrometers, which corresponds to 10 percents (i.e., 0.1 times) of the diameter of the primary resin particle 45. As the number of the first cavities 34 formed in the primary resin particle 45 increases, the malleability of the subsequently formed conductive particle 100 containing the primary resin particle 45 increases. For example, as described above, if the first cavities 34 is formed up to about 0.4 micrometers inwards of the surface of the primary resin particle having a diameter of 4 micrometers, the malleability can be improved by about 10 percents, as compared with a conductive particle produced from a primary resin particle not formed with the first cavities.

Although the first cavities 34 are formed on the surface 47 of the primary resin particle 45, the surface 47 of the primary resin particle 45 is substantially flat except for the concave portions caused by the first cavities 34. This is because the solvent 60 is not reacted with the resin 40, as is shown in FIG. 7B.

Figure 8B:
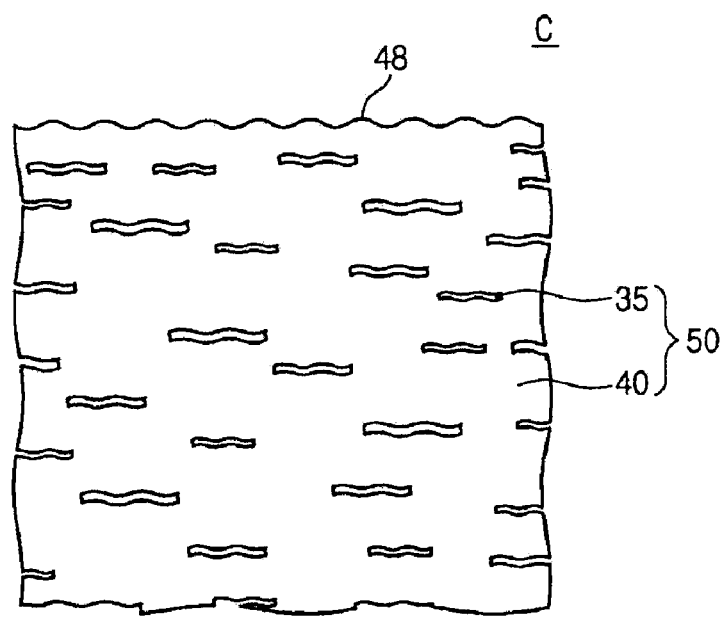
FIG. 8B is an enlarged view for the portion C in FIG. 8A.

FIG. 8A is a sectional view for the resin particle shown in FIG. 5, and FIG. 8B is an enlarged view for the portion C in FIG. 8A. Particularly, FIG. 8B shows detailed configurations for the surface of the resin particle shown in FIG. 8A.

Referring to FIGS. 8A and 8B, second cavities 35 are partially formed in the secondary resin particle 50 after the heat-treatment. More specifically, it is assumed, as shown in FIG. 8A, that the secondary resin particle 50 is defined as a sphere having a first radius d1 and an imaginary sphere having a second radius d2 is formed inside of the sphere, the both spheres having a common center point CP. Then, the second cavities 35 are considered to be formed in the region outside of the imaginary sphere of radius d2. In other words, the second cavities 35 are formed spaced apart from the point CP in a way to surround the imaginary sphere.

Referring to FIGS. 7 and 8, it can be seen that the second cavities 35 take a linear shape, as compared with the first cavities 34. This is because the resin 40 surrounding the second cavities 35 is reflowed when the primary resin particle 45 is heat-treated, and thus the shape of the first cavities 34 is changed into a rather flat form.

The secondary resin particle 50 is provided with fine concave portions on the surface 48 thereof which are formed by the second cavities 35. That is, the first cavities 34 are changed into the second cavities 35 having a flat form during the heat-treatment process, and the secondary resin particle 50 is shrunk by a volume difference between the first and second cavities 34 and 35 such that the fine concave portions are formed on the surface 48 of the secondary resin particle 50. Since the fine concave portions are randomly formed on the surface 48 of the resin particle 50 in enormous number, they may appear to be wrinkles.

Figure 9:
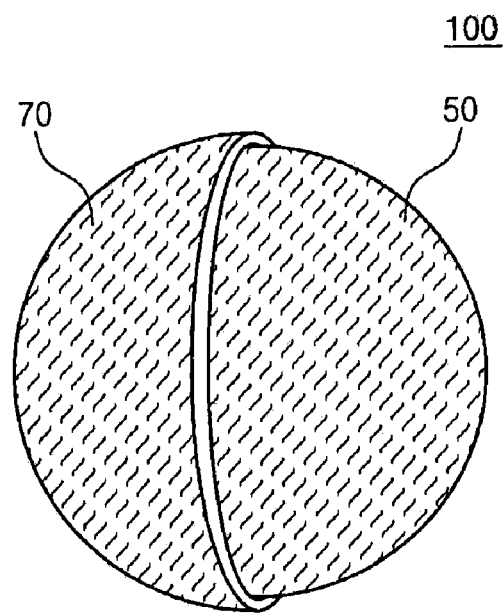
FIG. 9 is a perspective view for the conductive particle shown in FIG. 6.

FIG. 9 is a perspective view showing the conductive particle of FIG. 6.

Referring to FIG. 9, the conductive particle 100 includes the secondary resin particle 50 and the conductive layer 70 that surrounds the secondary resin particle 50. In this embodiment, the conductive layer 70 is formed on the surface of the secondary resin particle 50 using plating technique, so that the concave portions (wrinkles) on the conductive layer 70 can remain on the surface of the conductive particle 100.

Figure 10:
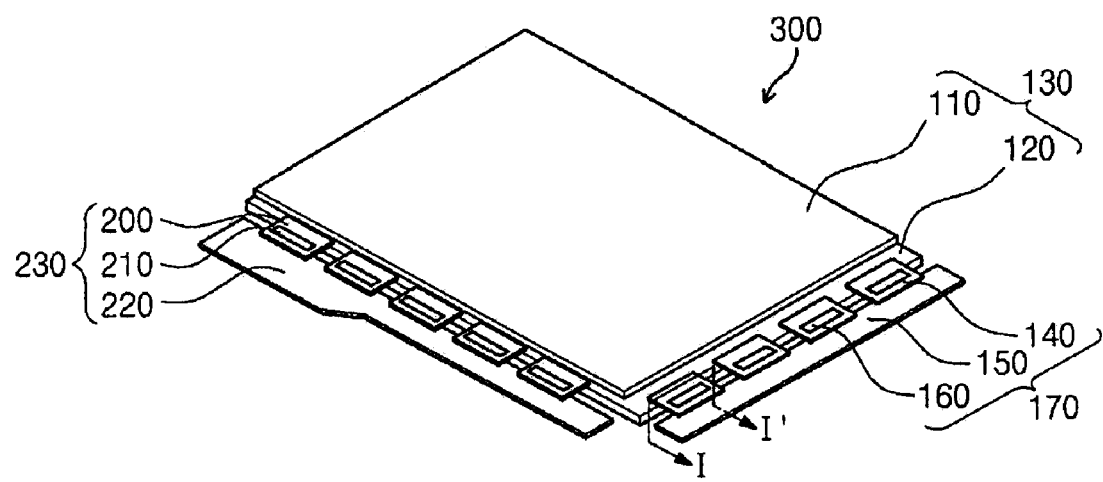
FIG. 10 is a perspective view showing a liquid crystal display according to an exemplary embodiment of the present invention.
Figure 11:
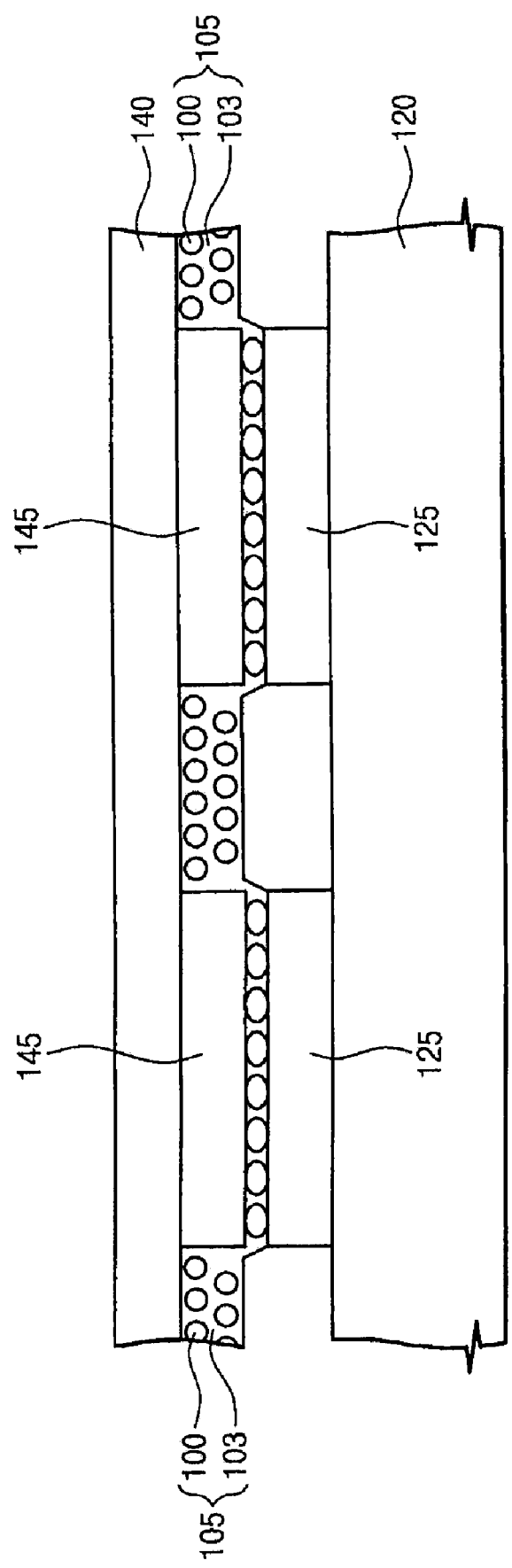
FIG. 11 is a sectional view taken along the line I-I' of FIG. 10.

FIG. 10 is a perspective view showing a liquid crystal display 300 according to an embodiment of the present invention. FIG. 11 is a sectional view taken along the line I-I' in FIG. 10.

Referring to FIG. 10, the liquid crystal display 300 includes a liquid crystal display panel 130 displaying an image in response to a pixel voltage, a gate driver 170 electrically connected to the liquid crystal display panel 130 to supply a gate signal to the liquid crystal display panel 130, and a data driver 230 electrically connected to the liquid crystal display panel 130 to supply a data signal to the liquid crystal display panel 130.

The liquid crystal display panel 130 includes an array substrate 120, a color filter substrate 110 facing the array substrate, and a liquid crystal layer (not shown) interposed between the array substrate 120 and the color filter substrate 110.

The array substrate 120 is formed of a transparent glass substrate on which thin film transistors (not shown) are arranged in a matrix configuration. Although not illustrated, the array substrate 120 includes pixel electrodes electrically connected to the thin film transistors. When the gate signal is applied to the thin film transistors from the gate driver 170, the thin film transistors are turned on such that a pixel voltage is applied to the pixel electrodes from the data driver 230.

The color filter substrate 110 includes a transparent glass substrate on which color filters each having a red, green, or blue color are formed. Also, the color filter substrate 110 includes a common electrode (not shown) formed over the color filter substrate 110. When a common voltage is applied to the common electrode, an electric field is formed between the common electrode and the pixel electrode, thereby controlling orientations of the liquid crystals within the liquid crystal layer.

The gate driver 170 includes a gate printed circuit board 150, a first driving chip 160, and a first tape carrier package (TCP) 140.

The gate printed circuit board 150 supplies a gate signal to the liquid crystal display panel 130. The gate printed circuit board 150 is electrically connected to the liquid crystal display panel 130 through the first TCP 140, thereby applying the gate signal generated by the gate printed circuit board 150 to the liquid crystal display panel 130.

The first TCP 140 includes an insulating film having a tape-like shape and a lead wire formed on the insulating film, and the first driving chip 160 is mounted on the lead wire. As shown in FIG. 11, the first TCP 140 includes a second terminal 145 that is electrically connected to a first terminal 125 formed on the array substrate 120. Accordingly, the first driving chip 160 mounted on the first TCP 140 controls the gate signal applied to the liquid crystal display panel 130 from the gate printed circuit board 150, so that the liquid crystal display panel 130 can display desired images.

In the present exemplary embodiment, as illustrated in FIG. 11, the first TCP 140 is electrically connected to the array substrate 120 by means of an anisotropic conductive film 105 disposed between the first and second terminals 125 and 145. The anisotropic conductive film includes the conductive particle 100 shown in FIG. 9.

The data driver 230 includes a data printed circuit board 220, a second driving chip 210, and a second TCP 200.

The data printed circuit board 220 supplies a data signal to the liquid crystal display panel 220. The data printed circuit board 220 is electrically connected to the liquid crystal display panel 130 through the second TCP 200, thereby applying the data signal from the data printed circuit board 220 to the liquid crystal display panel 130.

Referring to FIG. 11, the first TCP 140 includes the second terminal 145 having a metallic material, and the array substrate 120 includes the first terminal 125 having a transparent conductive material such as indium tin oxide or indium zinc oxide.

The anisotropic conductive film 105 is interposed between the first and second terminals 125 and 145. The anisotropic conductive film 105 includes an adhesive resin 103 and the conductive particle 100 dispersed inside the adhesive resin.

The adhesive resin 103 can be cured by heat or light. Thus, when the anisotropic conductive film is compressed, the conductive particle 100 therein is prevented from being returned into its original shape by the cured adhesive resin. In other words, the adhesive resin 103 is cured by heat or light while the conductive particle 100 is being compressed, and thus the conductive particle 100 remains in the compressed state by the cured adhesive resin 103.

When compressing the anisotropic conductive film 105 disposed between the first and second terminals 125 and 145, the conductive layer 70 formed on the surface of the conductive particle 100 within the anisotropic film is substantially simultaneously contacted to both the first and second terminals 125 and 145. Thus, the first terminal 125 and the second terminal 145 can be electrically connected to each other.

Figure 12A:
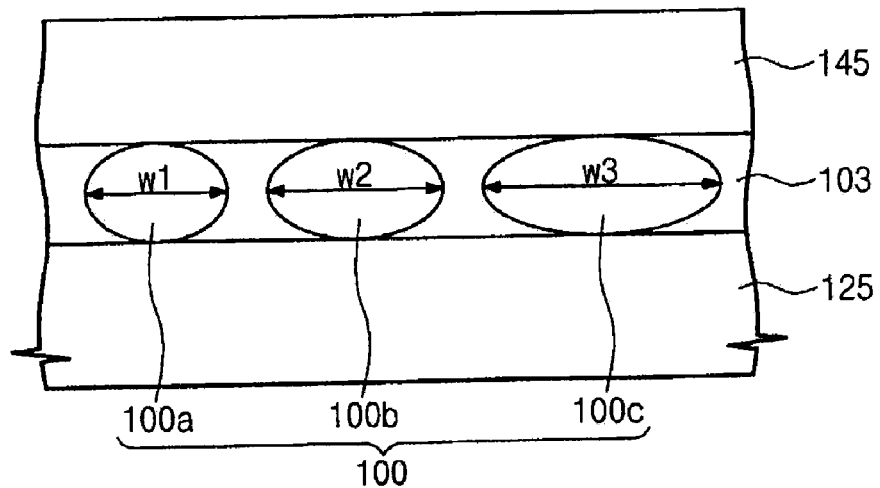
FIGS. 12A and 12B are enlarged views for the portion where a liquid crystal display panel and a gate driver are bonded to each other.
Figure 12B:
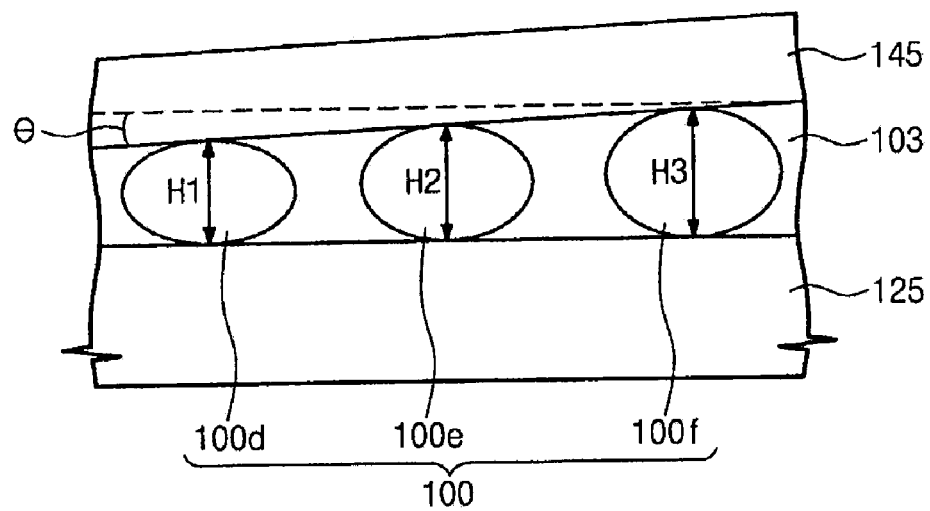

FIGS. 12A and 12B are enlarged views the portion at which the liquid crystal display panel and the gate driver are bonded to each other.

Referring to FIG. 12A, the conductive particle 100 is interposed between the first terminal 125 and the second terminal 145 and includes a number of conductive particles. For illustrative purpose, FIG. 12A shows a first conductive particle 100a, a second conductive particle 100b and a third conductive particle 100c, which have different diameters from each other.

Especially, the first conductive particle 100a has a diameter smaller than that of the second conductive particle 100b, and the second conductive particle 100b has a diameter smaller than that of the third conductive particle 100c. Accordingly, when the first, second and third conductive particles 100a, 100b and 100c are compressed between the first and second terminals 125 and 145, the compressed first, second and third conductive particles come to have width W1, W2 and W3 respectively where W1 is smaller than W2 and W2 is smaller than W3, as shown FIG. 12A.

As previously mentioned, the conductive particle 100 includes the second cavities 35 formed therein (see FIG. 8B). Due to the second cavities 35 formed in the conductive particle 100, the conductive particle 100 can readily absorb an external pressure, thereby providing an improved malleability to the conductive particle 100.

In particular, where the conductive particles 100 have different diameters from each other such as in the first, second and third conductive particles 100a, 100b, and 100c, the higher external pressure will be applied to the conductive particle, the higher diameter it has. For example, the applied external pressure will become larger in the order of the first, second and third conductive particles. However, the largest third conductive particle 100c can readily absorb the pressure as much, thereby enabling to mitigate the pressure being transmitted to the first terminal 125 or the second terminal 145.

If the pressure is not absorbed by the third conductive particle 100c and thus transmitted to the first terminal 125 through the third conductive particle 100c, the first terminal 125 including the transparent conductive layer or a thin film layer formed under the first terminal 125 may be damaged. However, according to the present exemplary embodiment, since the third conductive particle 100c is designed to sufficiently absorb the pressure, the first terminal 125 or the thin film layer under the first terminal 125 can not be easily damaged from the external pressure.

Referring to FIG. 12B, the second terminal 145 is inclined with respect to the first terminal 125 at an inclination angle (θ). Further, the conductive particles 100 disposed between the first and second terminals 125 and 145, i.e., fourth, fifth and sixth conductive particles 100d, 100e and 100f have a same diameter before compressed.

Therefore, when the inclined second terminal 145 compresses the fourth, fifth and sixth conductive particles 100d, 100e and 100f, different pressures are applied to the respective conductive particles depending upon their relative positions. That is, the pressure applied to the fourth conductive particle 100d is greater than the pressure applied to the fifth conductive particle 100e, and the pressure applied to the fifth conductive particle 100e is greater than the pressure applied to the sixth conductive particle 100f. Thus, the fourth conductive particle 100d has a height H1 smaller than a second height H2 of the fifth conductive particle 100e, and the sixth conductive particle 100f has a third height H3 larger than the second height H2 of the fifth conductive particle 100e.

Accordingly, although the different pressures are applied to the fourth, fifth and sixth conductive particles 100d, 100e and 100f, the conductive particles 100 can easily absorb the pressure applied thereto due to the second cavities formed in the particles such that the conductive particle 100 can be sufficiently and appropriately malleable between the first and second terminals 125 and 145.

Further, although the fourth conductive particle 100d is more strongly compressed, rather than the fifth and sixth conductive particles 100e and 100f, the cavities formed therein can absorb a large amount of the pressure. Thus, the pressure applied to the fourth conductive particle 100d cannot be easily transmitted to the first terminal 125 or the second terminal 145 to the extent to damage the first terminal 125 or the thin film layer formed under the first terminal 145.

As described above, the cavities formed inside the conductive particle (resin particle) provides an improved malleability to the anisotropic conductive adhesive containing the conductive particles. Thus, when the anisotropic conductive adhesive is compressed, the conductive particle can readily absorb the external compressive pressure. Thus, although the external pressure is applied to the anisotropic conductive adhesive interposed between the first and second terminals, the first terminal or the second terminal can be prevented from being damaged, due to the pressure absorption by the conductive particles, i.e., by the cavities formed therein.

Although the exemplary embodiments have been disclosed here, it is understood that the present invention is not limited to these exemplary embodiments, but various changes and modifications can be made by one ordinary skilled in the art within the spirit and scope of the present invention as defined by the appended claims.

In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims. Moreover, the use of the terms first, second, etc., do not denote any order or importance, but rather the terms first, second, etc., are used to distinguish one element from another. Furthermore, the use of the terms a, an, etc., do not denote a limitation of quantity, but rather denote the presence of at least one of the referenced item.

What is claimed is:

1. An anisotropic conductive adhesive comprising:
   an adhesive; and
   a conductive particle dispersed in the adhesive,
   wherein the conductive particle comprises:
       a particle that is provided with a cavity formed therein to have a concave portion at a surface thereof; wherein the cavity is formed at the surface of the particle and in the particle; and
       a conductive layer surrounding the particle.

2. The anisotropic conductive adhesive of claim 1, wherein the adhesive is cured by at least one of heat and light.

3. The anisotropic conductive adhesive of claim 1, wherein the particle comprises a reactant dispersed therein.

4. The anisotropic conductive adhesive of claim 3, wherein the reactant is partially removed from the particle to form the cavity.

* * * * *